United States Patent [19]

Blonder et al.

[11] Patent Number: 4,937,653
[45] Date of Patent: Jun. 26, 1990

[54] SEMICONDUCTOR INTEGRATED CIRCUIT CHIP-TO-CHIP INTERCONNECTION SCHEME

[75] Inventors: Greg E. Blonder, Summit; Theodore A. Fulton, Warren, both of N.J.

[73] Assignee: American Telephone and Telegraph Company, New York, N.Y.

[21] Appl. No.: 222,465

[22] Filed: Jul. 21, 1988

[51] Int. Cl.$^5$ .............. H01L 23/48; H01L 23/02; H01L 23/16; H01L 23/42
[52] U.S. Cl. ........................ 357/68; 357/74; 357/75; 357/79
[58] Field of Search .................. 357/68, 74, 75, 79

[56] References Cited

U.S. PATENT DOCUMENTS

| | | | |
|---|---|---|---|
| 3,349,296 | 10/1967 | Patalong | 357/79 |
| 4,104,676 | 8/1978 | Bednorz et al. | 357/79 |
| 4,263,702 | 4/1981 | Vig et al. | 29/25.35 |
| 4,670,770 | 6/1987 | Tai | 357/60 |
| 4,695,870 | 9/1987 | Patraw | 357/74 |
| 4,748,483 | 5/1988 | Dahlberg | 357/15 |

FOREIGN PATENT DOCUMENTS

| | | | |
|---|---|---|---|
| 0145476 | 11/1979 | Japan | 357/746 |
| 0186042 | 9/1985 | Japan | 357/74 |
| 0194545 | 10/1985 | Japan | 357/74 |
| 0877674 | 9/1961 | United Kingdom | 357/79 |

OTHER PUBLICATIONS

P. Kraynak, "Wafer-Chip Assembly for Large-Scale Integration," *IEEE Transactions on Electron Devices*, vol. ED-15, pp. 660-663 (1968).
R. F. Tylecote, *The Solid Phase Welding of Metals*, pp. 189-193 (1968).
G. A. Kennedy, *Welding Technology*, p. 15 (1974).

*Primary Examiner*—Rolf Hille
*Assistant Examiner*—David M. Ostrowski
*Attorney, Agent, or Firm*—David I. Caplan

[57] ABSTRACT

Integrated circuit chip-to-chip interconnections are made via gold pads on each chip that are bonded to corresponding gold pads on a silicon wafer chip carrier. The pads on the chips and/or the pads on the carrier are characterized by texturing (roughening) with a feature size of the order of a micrometer or less, so that each of the pads on the chip can be attached to each of the pads on the carrier by compression bonding at room temperature—i.e., cold-well bonding. In particular, the texturing of the gold pads on the silicon carrier is obtained by etching V-grooves locally on the surface of the underlying silicon carrier in the regions of the pads, thermally growing a silicon dioxide layer on the silicon carrier, and depositing the gold on the silicon dioxide layer.

12 Claims, 3 Drawing Sheets

4,937,653

SEMICONDUCTOR INTEGRATED CIRCUIT CHIP-TO-CHIP INTERCONNECTION SCHEME

TECHNICAL FIELD

This invention relates to semiconductor integrated circuits and more particularly to schemes for interconnecting one semiconductor integrated circuit (IC) chip to another on a chip-carrier.

BACKGROUND OF THE INVENTION

An IC chip of semiconductor silicon in present-day art can contain as many as several hundred thousand or even a million transistors. Electrical access to these transistors from one or more other silicon chips is limited by the number of input/output (I/O) ports, typically in the form of metallic pads, that can be fitted on the chip and be reliably electrically connected via metallic interconnection wiring to other chips. This limit on the number of I/O ports per chip undesirably limits the circuit design versatility of an IC chip and undesirably proliferates the number of chips required in IC technology for implementing a given electrical circuit.

One of the difficulties associated with any scheme for establishing chip-to-chip interconnections is that these interconnections must be accomplished with finished chips—i.e., chips having their integrated circuitry completed—so that by the time they are ready for chip-to-chip interconnections, the chips cannot withstand temperatures much above 300° C. or so without damaging their integrated circuitry.

In a paper entitled "Wafer-Chip Assembly for Large-Scale Integration" by P. Kraynak et al published in IEEE Transactions on Electron Devices, vol. ED-15 (1968), pp. 660-663, a chip-to-chip interconnection scheme is described in which the circuit face of each chip has a plurality of smooth metallic I/O pads, typically made of gold or aluminum. Each chip is oriented circuit-face-downward so that each of these pads (hereinafter "chip pads") is located in registry with a corresponding one of a plurality of smooth metallic pads located on a top surface of a flat silicon wafer serving as a chip-carrier (hereinafter "carrier"). The top surface of the carrier is coated with an insulating layer upon which a pattern of interconnection wiring, typically of aluminum, is deposited in accordance with a desired chip-to-chip electrical interconnection pattern. The pads on the top surface of the carrier (hereinafter "carrier pads") typically are simply formed by those portions of this chip-to-chip electrical interconnection wiring on the carrier which directly underlie (in registry with) the chip pads. Relatively low resistance contact-bonding between each carrier pad and its corresponding (in registry) chip pad is achieved by forming a metallic bump or glob of suitable metal—such as gold or solder—on each carrier pad or on each chip pad, or on both, followed by bonding each carrier pad to its corresponding chip pad by means of an ultrasonic, thermocompression, or solder-reflow bonding technique. The area of the top surface of the carrier is advantageously considerably larger than the area of a single chip. Thus more than one such chip can similarly be bonded onto a single carrier. The carrier, together with its interconnection wiring, thus serves as a chip-to-chip electrical interconnection means for the chips, as well as a thermal sink and a mechanical support member for each chip.

A problem that arises in the prior art is that the surface of the chip in general is bowed (curved) and hence not sufficiently flat to enable all metallic globs to come in contact with and be bonded to the corresponding carrier pads unless such high compressive forces be applied as to risk breaking the chip.

SUMMARY OF THE INVENTION

The foregoing problem associated with semiconductor IC chip-to-chip interconnection is mitigated in accordance with the invention by using chip pads directly bonded to carrier pads whose surfaces are rough or textured with feature sizes of the order (i.e., to within a factor of 10) of 1 micrometer, preferably feature sizes of about 1 or 2 micrometer or less. That is, for example, the textured surfaces of the carrier pads have indentations or grooves or protrusions whose depths or heights, preferably as well as their widths (measured at the top of the grooves), are about 1 micrometer or less. By the term "directly bonded" is meant bonded without interposition of any material between the carrier and chip pads that are thus bonded together. The nonzero depth of the texturing alleviates the problem arising from non-flatness of the surface of the chip.

For the purpose of ease of manufacture, typically the surfaces of only the carrier pads are textured; nevertheless, the invention also includes the case in which the chip pads are textured instead of, or in addition to, the carrier pads. Thus this invention involves:

(a) a semiconductor integrated circuit chip having an integrated circuit connected to a plurality of metallic chip pads located on a major surface of the chip;

(b) a carrier upon which are located metallic interconnections having metallic carrier pads that are bonded to the chip pads, each of the carrier pads, chip pads, or both having at least a portion thereof that is textured with a feature size of the order of a micrometer, preferably about one or two micrometer or less.

Both the chip pads and the carrier pads typically are made of, or are coated with, gold, so that the bonding is gold-to-gold. In preparation for and during the bonding of the carrier pads to the chip pads, no external heat need be applied, so that the bonding process herein comprises that which is known in the welding art as cold-welding or cold-weld bonding, i.e., welding or bonding by means of compression at room temperature. The internal heat generated by the cold-welding typically causes a temperature rise of the chip circuitry which is insignificant. On the other hand, it should be understood that heating the carrier or chip pads to a temperature of about 300° C. or less before, during, or after welding in accordance with this invention is not precluded. Moreover, the surfaces of all carrier and pads can be pre-cleaned by exposure to short wavelength ultraviolet radiation that generates ozone; and this exposure can be performed in a vacuum chamber, followed by compression bonding in this same chamber.

If it is desired to increase the mechanical compliance of the resulting structure in response to mechanically or thermally induced stress, then in accordance with another embodiment of the invention a portion of each chip pad is separated from the bottom surface of the chip by a localized layer of an insulating material (FIG. 6) having a thickness approximately the same as that of the chip pad, and only the portion of the surface of each carrier pad underlying the layer of insulating material need be textured while the remaining portion underlying the chip pad is indented in the vertical direction and is made to be smooth. The insulating material is selected so as to have relatively little or no adhesive tendency with respect to the chip pad.

It is believed that the ability to form, by means of compression at room temperature, a sufficiently strong gold-to-gold bond between chip pad and corresponding carrier pad is attributable to a penetration through the very thin layer (about 1 nanometer) of foreign matter ordinarily coating the surfaces of the gold, by virtue of the forced sliding, squeezing and scraping of the bottom of chip pad along the sloping sides of the texturing, such as V-grooves, of the respective underlying carrier pad (FIG. 3), whereby fresh clean surfaces of chip pad and carrier pad are exposed to each other for mutual physical contact. At the same time, variations of distance between chip and carrier pads can be tolerated, within limits of course, because of the extrusion of more gold from the areas of contact between the originally more closely proximate pairs of chip and carrier pads, whereby the less closely proximate pairs can also make contact. However, it should be understood that the actual success of the invention does not depend upon the correctness of the foregoing theory.

BRIEF DESCRIPTION OF THE DRAWINGS

This invention together with its features and advantages may be better understood from the following detailed description when read in conjunction with the drawings in which.

Only for the sake of clarity, none of the drawings is to scale.

DETAILED DESCRIPTION

Figure 1:
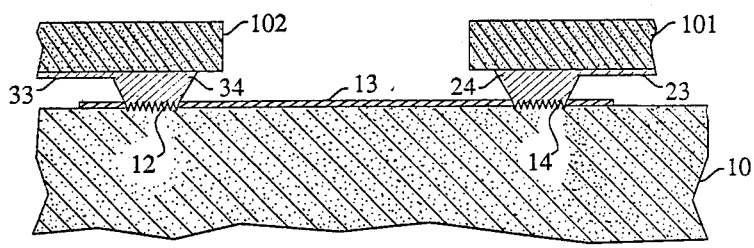
FIG. 1 is a side view in cross section of a semiconductor integrated circuit chip-to-chip interconnection scheme in accordance with a specific embodiment of the invention.

As shown in FIG. 1, a pair of semiconductor IC chips 101 and 102 are mounted circuit-face-down on a silicon wafer carrier 10. For the purpose of electrical insulation, the top surface of this carrier 10 is coated everywhere with a relatively thin layer 15 (FIG. 3) of silicon dioxide, typically about 0.1 micrometers in thickness. Each of the chips 101 and 102 has an illustrative metallized interconnect line 23 and 33, respectively, to be interconnected to each other. This interconnection is accomplished by means of illustrative chip pads 24 and 34, bonded to carrier pads 12 and 14, respectively, in combination with chip-to-chip interconnection wiring 13 located on the top surface of the carrier 10.

Each of the chip pads 24 and 34, or at least a bottom portion of each of these pads, advantageously is made of gold, preferably formed by sputter deposition through undercut apertures in a photoresist mask. Likewise a top portion of each of the carrier pads 12 and 14 is made of gold, for gold-to-gold welding of chip pads to carrier pads.

The chip pads 24 and 34 are formed so as to make contact with portions of the corresponding interconnect lines 23 and 33, respectively, as known in the art. Each of the carrier pads 12 and 14 is the corresponding respective textured portion of the wiring 13 underlying the chip pads 24 and 34, respectively. The top surface of each of the carrier pads 12 and 14, as well as the portions of the top surface of the carrier 10 itself at areas underlying these pads, is textured as explained more fully below. It should be understood that typically more than just the two chips 101 and 102 are mounted on the carrier 10 and that typically each of the chips contain hundreds if not thousands of lines to be interconnected with lines of other chips, whereas FIG. 1 shows only one illustrative example out of many such chip-to-chip interconnections and only two of such chips out of many possible chips that are interconnected via wiring on the carrier 10.

Figure 2:
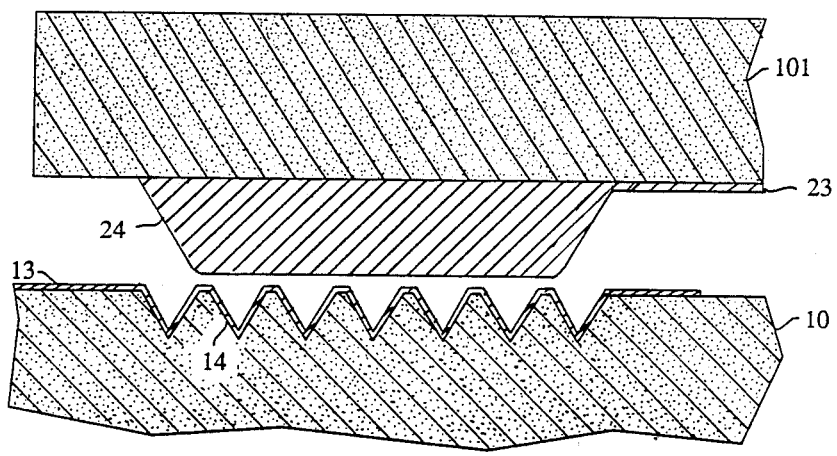
FIG. 2 is a somewhat enlarged side view in cross section of a portion of the scheme shown in FIG. 1 just prior to assembly by bonding.

As shown in FIG. 2, which is an enlarged view of a portion of FIG. 1 just prior to assembly of the chip 101 to the silicon carrier 10, the top surface of the silicon carrier 10 at areas underlying the pads is patterned, "roughened", or "textured" with rather closely packed V-shaped grooves. For example, each of the grooves measures about 1 by 1 micrometer square across the top, and the distance between centers of nearest neighboring grooves is about 3 micrometers or less. These grooves are fabricated by known photolithographic masking and anisotropic wet chemical etching techniques for silicon, such as the wet etch KOH on the (100) crystal plane of silicon whereby each of the sides of the resulting V-grooves is parallel to the (111) or to the (1 11) crystal plane. Subsequently the silicon dioxide layer 15 (FIG. 3) is thermally grown upon the top surface of the silicon wafer including upon the V-grooves.

Assembly of each chip onto the carrier—i.e., compression bonding of chip pads to carrier pads—is accomplished by cleaning and aligning the chip pads with the respective corresponding carrier pads and applying a mechanical pressure (compression) of about 20 to 40 kg-force/mm$^2$ of pad area to the chip and carrier at room temperature (with no applied heat) for a time interval of about 5 seconds, in order to press the bottom surfaces all chip pads in the chip simultaneously against the top surfaces of the respective carrier pads. Because the alignment is done at room temperature, it is ordinarily sufficient to align but two mutually diagonally situated pads, whereby all the other pads are automatically aligned. To clean the chips, before bonding them to the carrier, in particular, to clean them of photoresist, standard techniques are employed.

The resulting bonding of chip pads to carrier pads can be made stronger by applying ultrasonic waves to the pads during the compression bonding or by heating the pads with a laser beam focused on each pad after bonding. A carbon dioxide laser, which has a wavelength of about 10 micrometers (to which the silicon carrier is transparent), is useful for this purpose.

In the absence of the laser heating or the ultrasonic waves, the bonding of chips to carrier is reversible, in that one or more selected chips can be separately detached intact and removed from the carrier without damaging it simply by a mechanical pulling apart. This removability may be very advantageous in case one or more of the chips cease to function properly, in which case the improperly functioning chip(s) can be detached from the carrier simply by pulling apart such chip(s) from the carrier with an applied tensile stress of about 1 kg-force/mm$^2$ of total pad area or more without damaging the carrier, and replacing the thus detached chip(s) with properly functioning chip(s), again by means of cold-welded compression bonding of chip and carrier pads. Alternatively, some or all functioning chips bonded to a given carrier can be detached therefrom by pulling and then bonded to another carrier having a different wiring pattern, in order to use some or all of the same chips in a different chip-to-chip electrical interconnection configuration.

Figure 3:
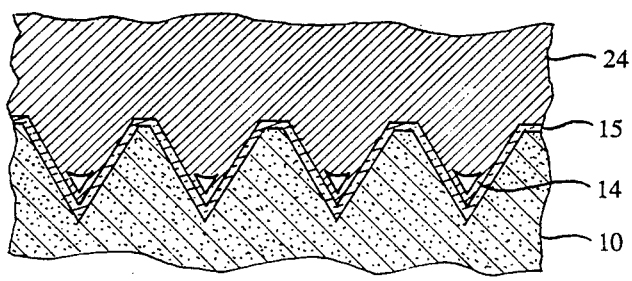
FIG. 3 is a somewhat more enlarged side view of a portion of the scheme shown in FIG. 1.

As shown in FIG. 3, an enlarged portion of FIG. 2 after assembly of chip to carrier by means of the mechanical pressure described above, as the chip 101 is pressed against the carrier 10, the gold of the pad 24 is squeezed and rubs along sloping portions of the V-shaped grooves (hereinafter "V-grooves"), thereby exposing fresh gold surfaces of both the chip pad and the carrier pad, so that the result is a mechanically reliable cold-welded joining room-temperature bonding of chip pads to carrier pads.

Figure 4:
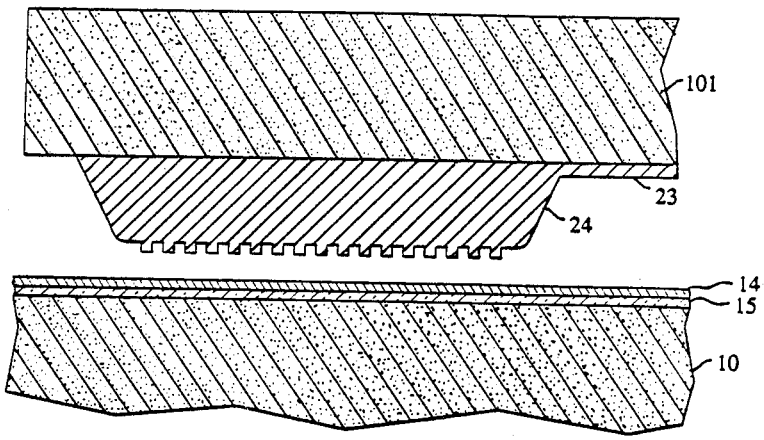
FIG. 4 is a side view in cross section of a semiconductor integrated circuit chip-to-chip interconnection scheme just before assembly, in accordance with another specific embodiment of the invention.

As shown in FIG. 4, bottom gold surfaces of the chip pads can be textured with a feature size of about 1 micrometer, instead of (or in addition to) texturing the top surface of the carrier pads. Such texturing of the gold surfaces of the chip pads can be accomplished by photolithographic masking and etching of the gold or by electroplating gold on nickel—a process that automatically results in a textured gold surface.

Figure 5:
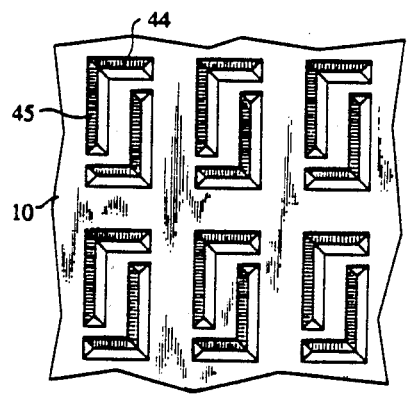
FIG. 5 is top view of a position of a textured chip-carrier in accordance with yet another specific embodiment of the invention.

The V-grooves as viewed from the top can also take the form of nested L's instead of squares, as shown in FIG. 5, where each L-shaped groove 44 has sides that slope downward to the bottom 45 of the groove. The width of the two elongated mask openings defining each L-shaped groove is typically about 1 micrometer, and the space between nearest adjacent L's is typically about 2 micrometers, whereby the L's are on about 3 micrometer centers.

More specifically, in the FIG. 1 embodiment, each of the interconnect lines 23 and 33 is typically made of a single layer of aluminum having a thickness of about one-half to one micrometer and a width of about two micrometers or less, or it can be made in the form of a layered structure of aluminum-titanium-platinum-gold or aluminum-titanium-platinum-gold-tin-gold likewise having a total thickness of about 0.10 micrometers, and a width of about one micrometer or less, with the titanium having a thickness of about 0.05 micrometers. The thickness of each of the chip pads 24 and 34 is typically about 3 micrometers of gold or more, and its width dimensions are typically about 10 by 10 micrometers square. It should be understood, of course, that the chip (and hence carrier) pad shapes as viewed from a vertical direction can be arbitrary: squares, rectangles, circles, etc. The metallization of each carrier pad is typically a gold layer having a thickness of about 0.3 micrometers on a layer of titanium having a thickness of about 0.05 micrometers, the titanium ensuring adhesion of the gold to the underlying silicon dioxide layer 15. The wiring 13 on the carrier 10 is typically made of the same material and thickness as those of the interconnect lines 23 and 33, but everywhere (including the regions of the carrier pads 12 and 14) the wiring 13 has a width of about 10 micrometers or slightly more, i.e., substantially the same width as that of the chips pads except for perhaps an added, relatively small safety margin in the width of the carrier pad.

The space between nearest adjacent chip pads is about 10 micrometers. The distance between centers of nearest neighboring chip pads thus is as little as about 20 micrometers or less. In this way a chip having a size of 1 cm by 1 cm—a periphery of 4 cm—can have as many as 2000 pads or more, i.e., one pad deep along the entire periphery of the chip, and can have many more pads if pads are also built at interior portions of the chip in addition to the periphery thereof. Pads thus located at interior portions have advantages in that thermal conductance and hence heat-sinking of the chip to the carrier is improved in magnitude and in uniformity, and in that the parasitics associated with long conductive paths on the chip from interior to periphery can be reduced. Moreover, in view of the relatively large number of pads, either non-electrically-functional ("dummy") pads or electrically functional redundant pads can be used for increased strength of attachment, increased electrical reliability, and improved heat-sinking.

It should be understood that the interconnection wiring on the carrier at portions thereof underlying the chips but removed from the pads, as well as between chips, can be fabricated with gold or other metals —such as aluminum. The wiring on the carrier can be fabricated on one or more planes ("metallization levels") that are insulated from one another by insulating layers, for example, of silicon dioxide or phosphorous doped glass, as known in the art. Accordingly, any desired wiring pattern including cross-overs can be fabricated on the carrier as known in the art.

Backside contact (not shown) of the chip to the carrier can be made by means of a fine gold wire which is bonded, after assembly of chip carrier, by means of silver-epoxy both to the backside of the chip and to a matching, typically smooth pad on the carrier.

Figure 6:
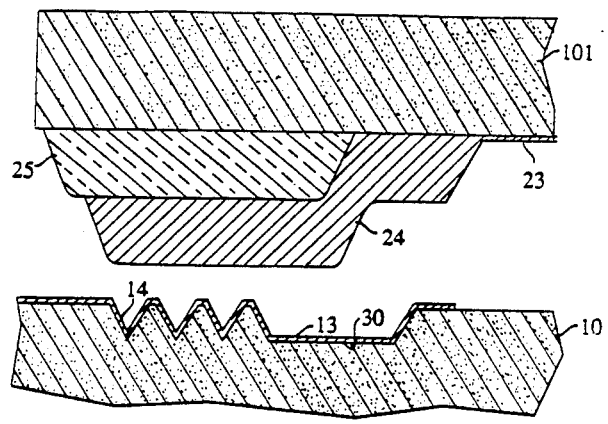
FIG. 6 is a somewhat enlarged sideview in cross section of a portion of FIG. 1 just prior to assembly by bonding, according to another specific embodiment of the invention.
Figure 7:
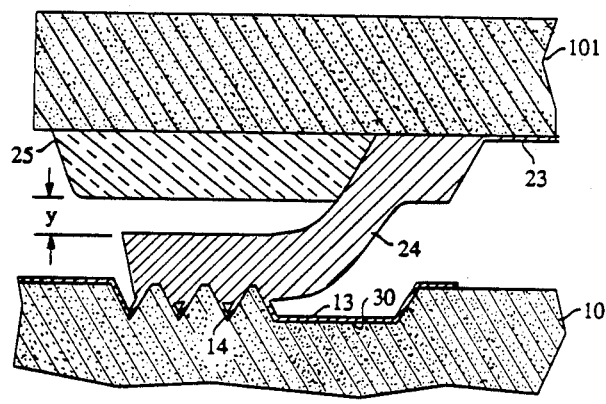
FIG. 7 is a sideview in cross section of the same portion as FIG. 6 just after assembly.

Another specific embodiment is illustrated in FIGS. 6 and 7, in which the same reference numerals are used for elements corresponding to those shown in FIGS. 1–3. In this embodiment (FIGS. 6 and 7) an insulating spacing layer 25 separates the bottom surface of the chip 101 from a left-hand moiety of the chip pad 24. Typically, this layer 25 is hard baked photoresist or silicon nitride 3 micrometers thick, to which adherence of the gold of the chip pad is minimal or zero. A portion 30 of the top surface of the silicon carrier 10 underlying the right-hand moiety of the spacing layer 25 is smooth and is vertically indented ("sunken") beneath the original top surface of the silicon to a depth corresponding to the bottom of the V-grooves. Vertical indenting of the portion 30 can be obtained by photolithographic masking and etching at the same time as the photolithographic masking and etching of the V-grooves.

Starting with the situation shown in FIG. 6, mechanical compression is applied followed by a slight mechanical pulling which is sufficient to produce a vertical spacing y (FIG. 7) between the top left-hand surface of the chip pad 24 and the bottom left-hand surface of the spacing layer 25, and which is sufficient to produce vertical spacing between the chip pad 24 and the sunken surface portion 30. Typically, this spacing y is about 2 micrometers. Prior to electrical utilization of the circuitry of the chip 101, the layer 25 can be removed as by an oxygen plasma treatment of the photoresist material (but not if silicon nitride) thereof, in order to have greater compliance—i.e., greater leeway or margins in case of change in bowing of the bottom surface of the chip. This structure (FIG. 7) has the added advantage of relative freedom from strains induced by unequal thermal expansion of the chip 101 and the carrier 10 in the lateral direction due to unequal temperature changes. Hence this structure promises to withstand such strains, in case they indeed occur during operation, as might cause failures of the embodiment shown in FIGS. 1–3. For greater mechanical strength, nickel plated with gold can be used as the material for chip pad 24.

Figure 8:
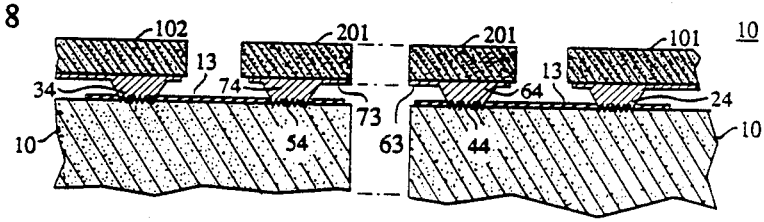
FIG. 8 is a sideview in cross section of a semiconductor integrated circuit chip-to-chip interconnection scheme in accordance with yet another specific embodiment of the invention.

FIG. 8 shows another embodiment, wherein some or all chip-to-chip interconnection is obtained through a separate chip-to-chip interconnection wiring plate 201. The plate 201 is attached to the carrier 10 by means of the interconnection plate pads 64 and 74 and typically many others (not shown) which are bonded to carrier pads 44 and 54 and typically many others (not shown). The bonding is achieved in the same way that, for example, the chip 101 is attached to the carrier 10 by means of chip pad 24 bonded to carrier pad 14. In this way the interconnection wiring portions 13 stemming from chips 101 and 102 are interconnected—and hence pads 24 and 34 are interconnected—through pads 64 and 174 of the interconnection plate 201 plus interconnect lines 63, 73, and perhaps others (not shown) of the plate 201.

The interconnection plate 201 can simply take the form of an IC chip having no transistors, but having only wiring (typically multi-level) arranged for electrically interconnecting the various interconnection plate pads. Each of the plate pads is constructed in the same way as an IC chip pad. Moreover, chip-to-chip electrical interconnection may be modified by mechanically pulling and removing the plate 201 and replacing it with another plate having a different pattern of interconnect lines. Also, failures in the chip-to-chip interconnection plate can be repaired by similarly removing the failed interconnection plate followed by replacement of another operative plate.

Although the invention has been described in detail with reference to specific embodiments, various modifications can be made without departing from the scope of the invention. For example, etch pits other than V-grooves in silicon can be used for texturing the surface of the carrier pads. In silicon, for example etch pits with crystallographic (111) sides on (110) oriented silicon wafer surfaces could be fabricated having vertical sidewalls rather than V-grooves. Instead of such etch pits or V-grooves which are L-shaped or are square shaped as viewed from the top, other shapes such as elongated trench V-grooves can be etched into the silicon carrier by using correspondingly shaped masking for the etching. The surface of the gold itself of the carrier pads could be directly textured (without first texturing the underlying silicon) by means of photolithographically etching the top surface of the gold carrier pads rather than the underlying silicon, or by electroplating the gold on nickel. Moreover, gold-plated nickel has mechanically stronger greater breaking strength than pure gold. This greater breaking strength is especially desirable in the embodiment of FIGS. 6–7 where, in response to the mechanical pulling, before the bonded portion can detach as is desired, there is an undesirable tendency for the central portion of the chip pad to tear or break and thus prevent re-use of chip on another carrier. Instead of grooves, texturing of a surface can be obtained by forming a multitude of pillars (columns), pyramids, or other protrusions on the surface.

Also, texturing of a surface can be accompanied anisotropically etching the entire surface to a prescribed depth except for the top of grooves which are masked against the etching. Alternatively, texturing can be achieved by selectively depositing metal only in the regions of the pads, followed by formation of grooves in the deposited metal layer. A single chip can be attached to the carrier, instead of more than one chip, simply for the purpose of mechanically and electrically stable external access.

Instead of silicon, other materials for the carrier may be used, such as glass or ceramic; and the chips themselves can be crystalline gallium arsenide instead of silicon.

Moreover the welding procedure of this invention could be done at temperature above or below room temperature—the former (but not above about 300° C.) for the purpose of stronger bonding, if desired, the latter for protecting the integrated circuitry by maintaining the temperature fairly low even in the presence of undesirable amounts of heat (if any) generated by the sliding of the chip pad surfaces along the textured carrier pad surfaces. The welding could also be done in an environment comprising a selected gas or liquid (such as for fluxing).

Finally the welding could be performed by the step of precleaning the surfaces of all pads by exposure to short ultraviolet light that generates ozone, i.e., light of wavelength equal to about 250 nanometers, followed by the step of compression bonding (cold-welding), with either or both steps being performed in a vacuum chamber.

We claim:
1. In combination
   (a) a semiconductor integrated circuit chip having an integrated circuit connected to a plurality of metallic chip pads located on a major surface of the chip;
   (b) a carrier upon which are located metallic wiring interconnections having metallic carrier pads that are bonded to the chip pads, each of the carrier pads, chip pads, or both having at least a portion thereof that is textured with indentations whose depths are, or protrusions whose heights are, of the order of one micrometer.

2. The combination described in claim 1 in which each chip pad has a portion that is separated from the major surface of the chip by a portion of a localized layer of an insulating material, and in which each carrier pad has a portion, underlying a complementary portion of the layer of insulating material, that is indented in the vertical direction and is smooth, the insulating material having relatively little or no adhesive tendency with respect to the chip pad.

3. The combination of claim 2 in which the carrier comprises a silicon wafer and in which the pads are bonded such that a tensile force of about 1 kg per mm$^2$ or more of pad area is required to pull them apart.

4. The combination of claim 3 in which the silicon wafer has a plurality of V-grooves at each of such portions thereof underlying the carrier pads.

5. The combination of claim 2 in which surfaces of the chip pads are essentially gold.

6. The combination of claim 5 in which surfaces of the carrier pads are essentially gold and in which the chip pads are nondestructively detachable from the carrier pads by means of a mechanical pulling apart.

7. The combination of claim 1 in which the chip carrier comprises a silicon wafer which is textured at the portions thereof underlying the carrier pads.

8. The combination of claim 7 in which the silicon wafer has a plurality of V-grooves at each of such portions thereof underlying the carrier pads.

9. The combination of claim 1 in which areas of the carrier pads to be bonded to chip pads are essentially gold and in which the chip pads are nondestructively detachable from the carrier pads by means of a mechanical pulling apart.

10. The combination of claim 10 in which the surfaces of the chip pads are essentially gold.

11. The combination of claim 1 in which surfaces of the chip pads are essentially gold.

12. The combination of claim 1 in which the indentations or protrusions have widths, as measured at the tops of the protrusions or bottoms of the indentations, of about 1 micrometer or less.

* * * * *

UNITED STATES PATENT AND TRADEMARK OFFICE
CERTIFICATE OF CORRECTION

PATENT NO. : 4,937,653

DATED : June 26, 1990

INVENTOR(S) : Greg E. Blonder and Theodore A. Fulton

It is certified that error appears in the above-identified patent and that said Letters Patent is hereby corrected as shown below:

Column 10, line 4, "claim 10" should read --claim 9--.

Signed and Sealed this

Nineteenth Day of May, 1992

*Attest:*

DOUGLAS B. COMER

*Attesting Officer*   Acting Commissioner of Patents and Trademarks